US012573248B2

(12) United States Patent
Yhr

(10) Patent No.: US 12,573,248 B2
(45) Date of Patent: Mar. 10, 2026

(54) ELECTRONIC CONTROL UNIT FOR A VEHICLE CAPABLE OF CONTROLLING MULTIPLE ELECTRICAL LOADS

(71) Applicant: VOLVO TRUCK CORPORATION, Gothenburg (SE)

(72) Inventor: Hamid Yhr, Gråbo (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 277 days.

(21) Appl. No.: 16/334,595

(22) PCT Filed: Sep. 29, 2016

(86) PCT No.: PCT/EP2016/073199
§ 371 (c)(1),
(2) Date: Mar. 19, 2019

(87) PCT Pub. No.: WO2018/059686
PCT Pub. Date: Apr. 5, 2018

(65) Prior Publication Data
US 2021/0295616 A1     Sep. 23, 2021

(51) Int. Cl.
| | |
|---|---|
| *G01R 31/00* | (2006.01) |
| *G01R 31/52* | (2020.01) |
| *G07C 5/08* | (2006.01) |

(52) U.S. Cl.
CPC ......... *G07C 5/0808* (2013.01); *G01R 31/006* (2013.01); *G01R 31/52* (2020.01)

(58) Field of Classification Search
CPC .... G07C 5/0808; G01R 31/006; G01R 31/52; B60L 3/0069; B60L 15/20; B60L 2240/421; B60L 2240/527; B60L 2240/547; B60L 3/0023; B60L 3/0046; B60L 3/04;
(Continued)

(56) References Cited

U.S. PATENT DOCUMENTS

| | | | |
|---|---|---|---|
| 4,771,755 A | 9/1988 | Asakura et al. | |
| 4,951,632 A | 8/1990 | Yakuwa et al. | |

(Continued)

FOREIGN PATENT DOCUMENTS

| | | |
|---|---|---|
| CN | 202402149 U | 8/2012 |
| DE | 19510817 A1 | 9/1996 |

(Continued)

OTHER PUBLICATIONS

International Search Report dated Jul. 6, 2017 in International Application No. PCT/EP2016/073199.
(Continued)

*Primary Examiner* — Matthew J. Reda
(74) *Attorney, Agent, or Firm* — Jeffri A. Kaminski; Venable LLP

(57) ABSTRACT

The present disclosure generally relates to an electronic control unit (ECU) for a vehicle, specifically adapted for controlling a transition between and active and an inactive state in case a thereto-connected electrically controllable vehicle component is operating outside an individualized and predefined load profile. The present disclosure also relates to a method for operating such an electrical control unit and to a corresponding computer program product.

7 Claims, 4 Drawing Sheets

(58) Field of Classification Search
CPC .......... B60L 50/16; B60L 58/10; B60D 1/01;
B60D 1/167; B60D 1/64; B60Q 1/305
See application file for complete search history.

(56) References Cited

U.S. PATENT DOCUMENTS

| | | | | |
|---|---|---|---|---|
| 7,746,219 | B1* | 6/2010 | Paul ....................... | B60Q 1/305 |
| | | | | 340/431 |
| 2004/0130296 | A1* | 7/2004 | Gross ................. | G01R 31/3648 |
| | | | | 320/133 |
| 2005/0131601 | A1 | 6/2005 | Kunihiro et al. | |
| 2005/0236900 | A1 | 10/2005 | Kahara et al. | |
| 2007/0057678 | A1* | 3/2007 | Dvorak ................ | H02H 1/0015 |
| | | | | 324/536 |
| 2007/0069734 | A1* | 3/2007 | Bertness ............ | G01R 31/3648 |
| | | | | 324/411 |
| 2008/0084229 | A1* | 4/2008 | Frommer ............... | G01R 31/34 |
| | | | | 324/765.01 |
| 2010/0289447 | A1* | 11/2010 | Dobson ..................... | H02J 7/00 |
| | | | | 320/101 |
| 2011/0231042 | A1* | 9/2011 | Ueda ..................... | B60L 3/0084 |
| | | | | 903/902 |
| 2013/0116875 | A1* | 5/2013 | Oh .......................... | B60L 53/14 |
| | | | | 701/22 |
| 2014/0056599 | A1* | 2/2014 | Spink ..................... | G03G 15/55 |
| | | | | 399/12 |
| 2014/0104736 | A1 | 4/2014 | Dougherty | |

| | | | | |
|---|---|---|---|---|
| 2014/0114510 | A1* | 4/2014 | Vernacchia ............. | B60L 50/60 |
| | | | | 701/29.2 |
| 2014/0117925 | A1* | 5/2014 | Pischke ................... | H02J 1/102 |
| | | | | 320/107 |
| 2014/0229038 | A1* | 8/2014 | Boy .......................... | H02J 3/14 |
| | | | | 701/33.9 |
| 2015/0022215 | A1* | 1/2015 | Philippart ............. | B60L 3/0069 |
| | | | | 324/503 |
| 2015/0224881 | A1* | 8/2015 | Deyda ................... | B60L 3/0015 |
| | | | | 701/29.2 |
| 2015/0371461 | A1* | 12/2015 | Treharne .............. | G07C 5/0816 |
| | | | | 701/31.4 |
| 2016/0006383 | A1* | 1/2016 | Kresca ...................... | H02J 7/14 |
| | | | | 322/15 |
| 2017/0033717 | A1* | 2/2017 | Ansbacher .............. | H02P 9/006 |
| 2017/0205451 | A1* | 7/2017 | Moinuddin ............ | G01R 31/52 |
| 2017/0276077 | A1* | 9/2017 | Augst ................. | F02D 41/0025 |

FOREIGN PATENT DOCUMENTS

| | | | |
|---|---|---|---|
| DE | 102012207747 | A1 | 11/2013 |
| DE | 102014204128 | A1 | 9/2015 |
| EP | 1636560 | A1 | 3/2006 |

OTHER PUBLICATIONS

International Preliminary Report on Patentability dated Jan. 9, 2019 in International Application No. PCT/EP2016/073199.

* cited by examiner

*100*

*102*

216

217

From
control unit 200

208

To
control unit 200

218

222

220

208

To/from
driver 216

1
n

1
N

210

224

ELECTRONIC CONTROL UNIT FOR A VEHICLE CAPABLE OF CONTROLLING MULTIPLE ELECTRICAL LOADS

TECHNICAL FIELD

The present disclosure generally relates to an electronic control unit (ECU) for a vehicle, specifically adapted for controlling a transition between and active and an inactive state in case a thereto-connected electrically controllable vehicle component is operating outside an individualized and predefined load profile. The present disclosure also relates to a method for operating such an electrical control unit and to a corresponding computer program product.

BACKGROUND

Modern vehicles are equipped with numerous electrically controllable components, including everything from smaller electrical motors for operating windows, windscreen wipers and doors; actuators used in relation to the engine of the vehicle or for controlling elements of a break system; light sources for interior and/or exterior lighting; and similar. Typically, such electrically controllable components are activated/deactivated by a user operating an electrical switch, or automatically as a result of a determination made by an electronic control unit (ECU) comprised with the vehicle based on e.g. data received from monitoring sensors, the sensors also comprised with the vehicle.

The ECU typically makes use of a separate driver circuitry for activating/deactivating the electrically controllable components, where the ECU only provides a control signal to the driver, and the driver in turn handles/switches the electrical load of the electrically controllable components. Generally, there is a necessity to make sure that the electrical load of the electrically controllable component does not exceed a rating for the driver, e.g. due to a faulty component, short circuit, etc. From the above, it is understood that some form of functionality is necessary for protecting the ECU as well as separate the driver circuitries, assuring that electrical power provided to the electrically controllable component is safely switched off in case of a fault detection, such as resulting from a faulty electrically controllable component.

US2015022215 implements such a solution for protecting the electrical components comprised with a vehicle. In US2015022215, an electronic control system is provided with a fault diagnostic module that is adapted to determine whether a voltage provided to electrically controllable component is in a first range or a second range, where the first range and the second range indicate that a fault is detected in the electrically controllable component. In case a fault is detected, the electrically controllable component is deactivated.

Even though US2015022215 provides an interesting approach for protecting the electrical components comprised with a vehicle, the solution presented is only suitable for handling some types of vehicle components, not providing the necessary flexibility needed in a modern vehicle. Accordingly, it would be desirable to provide further enhancements for monitoring and operating electrically controllable components comprised with a vehicle, specifically ensuring that a multitude of different electrically controllable vehicle components may be operated in the best possible way while ensuring a high security level in case of e.g. a faulty component.

SUMMARY

According to an aspect of the present disclosure, the above is at least partly alleviated by an electronic control unit (ECU) for a vehicle, the ECU comprising a first and a second control port configured to be connected to a first and a second electrically controllable vehicle component, respectively, wherein the first and the second control port each comprises an individual driver circuitry, an individual load profile is defined for each of the first and the second electrically controllable vehicle component, and each driver circuitry is configured to individually measure an intermediate electrical load for the respectively connected electrically controllable vehicle component, wherein the ECU is configured to compare each of the measured intermediate electrical loads with the respective individual load profile for the first and the second electrically controllable vehicle component, and to control a transition between at least a first and a second operational state for the respective first and second individual driver circuitry based on a result of the comparison.

In accordance to the present disclosure, the ECU is adapted to store an individual load profile for each of the electrically vehicle component to be controlled by the ECU. In addition, while the connected electrically vehicle components are in operation, a monitoring functionality is put in place, where an intermediate load for each connected electrically vehicle component is compared to the corresponding individualized load profile.

The suggested way of structuring the implementation for control of the electrically vehicle components allows for an holistic approach in operating a large plural plurality of electrically vehicle components, including the first and the second electrically vehicle component, by using a centralized computing device (i.e. the ECU) rather than distributing the operation to "intelligent" drivers to be used control the electrically vehicle components.

That is, in accordance to the present disclosure the "intelligence" may be placed centrally, and use driver circuitry with an in comparison low amount of included monitoring/control functionality, rather allowing this functionality to be placed within the ECU. In addition, as the intelligence is implemented centrally rather than in a distributed manner, it is possible to facilitate the use of individual load profiles, something that typically would be out of reach in case of a distributed control system (where such information in such a case could have needed to be provided to/stored with the connected driver circuitry).

It is advantageous to adapt the individual load profile to define an acceptable load range for each of the corresponding one of the first and the second electrically controllable vehicle component. That is, instead of just relaying on single thresholds for the acceptable operation of the electrically vehicle component, it is according to the present disclosure possible to define suitable ranges for each of the connected and controlled electrically controllable vehicle component, individually specified to correspond to a typical behavior of that specific electrically controllable vehicle component. The individual load profile, and thus also the range of the load profile, may typically be different for the first and the second electrically controllable vehicle component (i.e. in case the first and the second electrically controllable vehicle component are different from each other).

The individual load range is preferably defined for at least one of a load voltage, a load current and a load duration. It is of course possible and within the scope of the present disclosure to combination of at least two of the load voltage, the load current and the load duration, and monitor/control the electrically controllable vehicle component accordingly. For example, it could be possible to allow the current to be above a specified threshold/range for a specified duration. That is, the current (or in a similar manner the voltage) to "overshoot" for a predefined (typically short) period. Thereby, an increased flexibility is allowed, for example in case with components having large a startup current/voltage (such as for example an electric motor), while still allowing the electrically controllable vehicle component to be transitioned to the second operational state in case the overshoot is longer than what is normal.

It accordance to the present disclosure is would also be possible to allow the range/threshold/profile to be adjustable, possible adjusted over time or based on a learning process coinciding with operation of the electrically controllable vehicle component. Thereby, the individual load profile may be defined to have an initial start condition that may be allowed to change over the lifetime/duration of controlling the electrically controllable vehicle component. That us, the load current may in some situations be expected to increase during the lifetime of the electrically controllable vehicle component to achieve the same output as was possible in the beginning of the life cycle of the electrically controllable vehicle component.

Preferably, the first operational state is an operative (ON) state (active state) and the second operational state is a non-operative (OFF) state (also referred in the present description as a de-activated or inactive state), and consequently each of the respective individual driver circuitry is set to the second state if a result of the comparison indicates that the intermediate load does not correspond to the related individual load profile. It should further be noted that it of course is possible to include more than just the first and the second electrically controllable vehicle component. In a typical vehicle implementation, a large plurality of electrically controllable vehicle component are controlled, generally well above a hundred electrically controllable vehicle component.

Thus, in such an implementation each of the electrically controllable vehicle components will have an individual load profile. However, it should be understood that it may be possible to assign a group of corresponding electrically controllable vehicle components to have the corresponding load profiles. In addition, it could be possible to allow portions of the load profile to be inherited within groups of electrically controllable vehicle components.

In a preferred embodiment of the present disclosure, the ECU is implemented using at least one of an FPGA, a CPU, a CPLD, or a SOC. Other similar programmable computing devices are of course possible and within the scope of the present disclosure. It should be understood that the ECU typically is an arrangement comprising a plurality of components/integrated circuits, including control circuitry for providing the computational power for making the above disclosed determinations, as well as the driver circuitry controlling the loads (i.e. electrically controllable vehicle components) connected to each of the ports comprised with the ECU.

In addition, as the listed programmable computing devices will have a limited number of ports, it may in one exemplary embodiment of the present disclosure be possible to arrange the ECU to further comprise at least one multiplexer connected to at least one of the first and the second control port, thereby allowing also at least a further third electrically controllable vehicle component to be connected to the ECU. Generally, at least one of first and the second control port is a dedicated output port. Possibly, at least one of first and the second control port may also be a dedicated bidirectional input and output port.

The disclosed ECU is typically provided as an onboard component of the vehicle, the vehicle for example being a bus, a truck a car, or any form of construction equipment. Advantageously, the vehicle preferably comprises the first and the second electrically controllable vehicle component, where at least one of the first and the second electrically controllable vehicle component, as mentioned above, is selected from a group comprising an actuator, a light source, and an electrical motor. Further types of electrically controllable vehicle components are of course possible and within the scope of the present disclosure.

According to another aspect of the present disclosure there is provided a method for operating an electronic control unit (ECU) for a vehicle, the ECU comprising a first and a second control port configured to be connected to a first and a second electrically controllable vehicle component, respectively, wherein the first and the second control port each comprises an individual driver circuitry, an individual load profile is defined for each of the first and the second electrically controllable vehicle component, and each driver circuitry is configured to individually measure an intermediate electrical load for the respectively connected electrically controllable vehicle component, wherein the method comprises the steps of comparing each of the measured intermediate electrical loads with the respective individual load profile for the first and the second electrically controllable vehicle component, and controlling a transition between at least a first and a second operational state for the respective first and second individual driver circuitry based on a result of the comparison. This aspect of the present disclosure provides similar advantages as discussed above in relation to the previous aspect of the present disclosure.

According to a further aspect of the present disclosure there is provided a computer program product comprising a non-transitory computer readable medium having stored thereon computer program means for operating an electronic control unit (ECU) for a vehicle, the ECU comprising a first and a second control port configured to be connected to a first and a second electrically controllable vehicle component, respectively, wherein the first and the second control port each comprises an individual driver circuitry, an individual load profile is defined for each of the first and the second electrically controllable vehicle component, and each driver circuitry is configured to individually measure an intermediate electrical load for the respectively connected electrically controllable vehicle component, wherein the computer program product comprises code for comparing each of the measured intermediate electrical loads with the respective individual load profile for the first and the second electrically controllable vehicle component, and code for controlling a transition between at least a first and a second operational state for the respective first and second individual driver circuitry based on a result of the comparison. Also this aspect of the present disclosure provides similar advantages as discussed above in relation to the previous aspects of the present disclosure.

The computer readable medium may be any type of memory device, including one of a removable nonvolatile random access memory, a hard disk drive, a floppy disk, a CD-ROM, a DVD-ROM, a USB memory, an SD memory card, or a similar computer readable medium known in the art.

Further advantages and advantageous features of the present disclosure are disclosed in the following description and in the dependent claims.

BRIEF DESCRIPTION OF THE DRAWINGS

With reference to the appended drawings, below follows a more detailed description of embodiments of the present disclosure cited as examples.

In the drawings.

DETAILED DESCRIPTION OF EXAMPLE EMBODIMENTS OF THE INVENTION

Figure 1A:
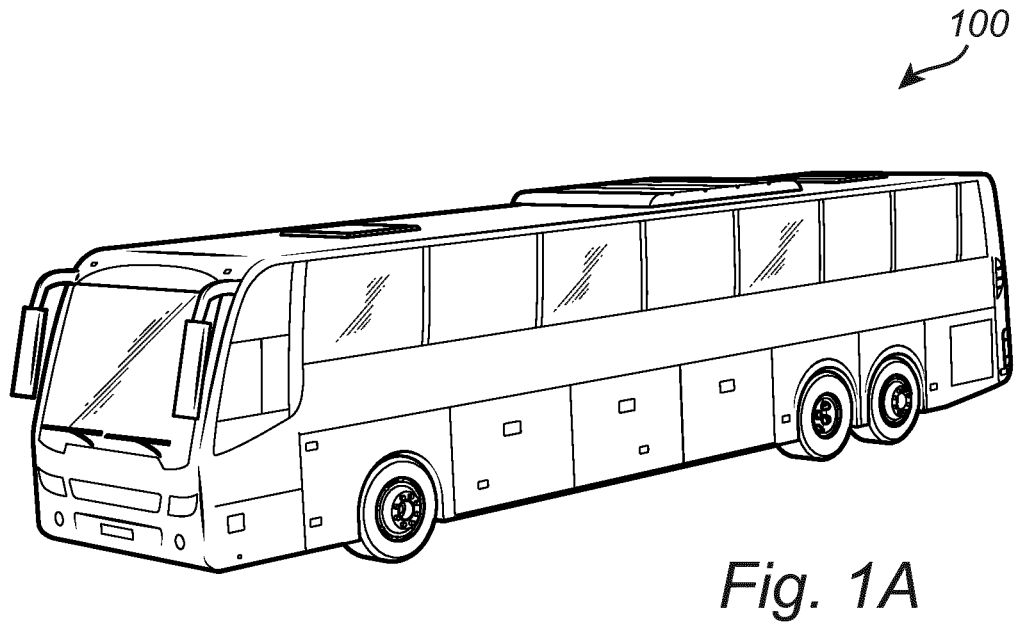
FIG. 1A illustrates a bus and 1B a truck in which an electronic control unit according to the present disclosure may be incorporated.

The present disclosure will now be described more fully hereinafter with reference to the accompanying drawings, in which currently preferred embodiments of the present disclosure are shown. This disclosure may, however, be embodied in many different forms and should not be construed as limited to the embodiments set forth herein; rather, these embodiments are provided for thoroughness and completeness, and fully convey the scope of the disclosure to the skilled addressee. Like reference characters refer to like elements throughout.

Figure 1B:
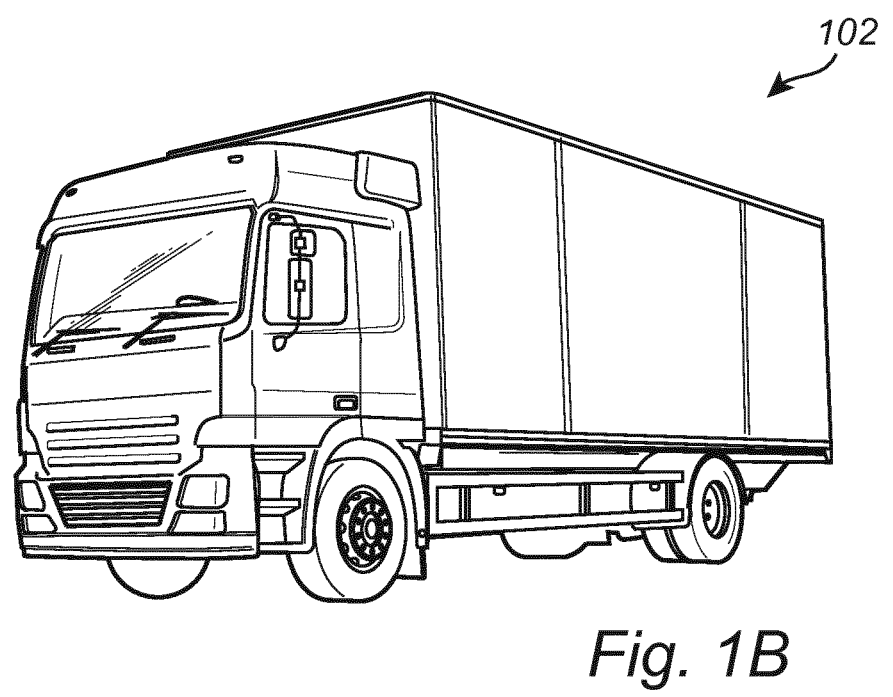

Referring now to the drawings and to FIGS. 1 and 2 in particular, there is in FIG. 1A depicted an exemplary vehicle, here illustrated as a buss 100, in which an electronic control unit (ECU) 200 according to the present disclosure may be incorporated. The ECU 200 may of course be implemented, possibly in a slightly different way, in a truck 102 as shown in FIG. 1B, a car, etc. The vehicle may for example be one of an electric or hybrid vehicle, or possibly a gas/gasoline/diesel vehicle. The vehicle comprises an electric machine (in case of being an electric or hybrid vehicle) or an engine (such as an internal combustion engine in case of being a gas/gasoline/diesel vehicle).

Figure 2A:
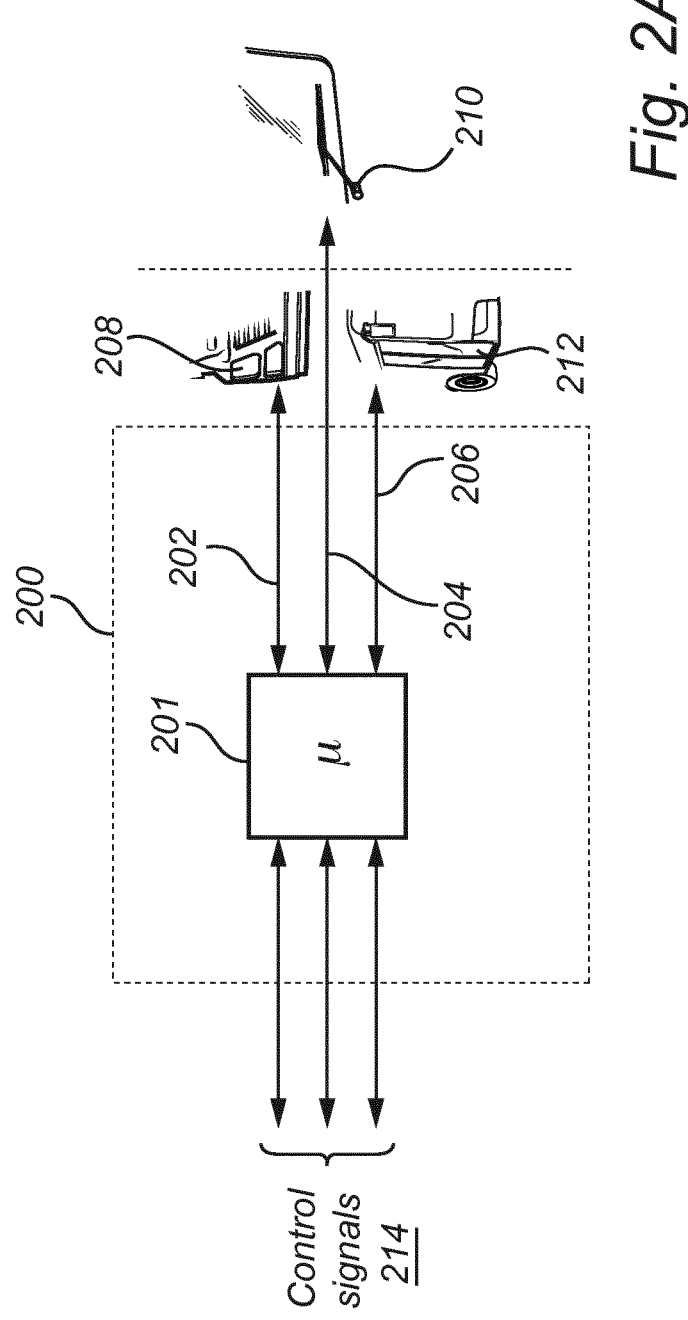
FIGS. 2A-2C conceptually shows an electronic control unit according to an embodiment of the present disclosure.

With further reference to FIG. 2A, a plurality of control lines 202, 204, 206 are provided for electrically connecting the ECU 200 and a corresponding plurality of electrically controllable vehicle components 208, 210, 212 (including the first and the second electrically controllable vehicle component). The plurality of electrically controllable vehicle components may for example include a light source 208 (e.g. for interior or exterior lighting of the vehicle), an actuator 210 (e.g. for use in relation to a windscreen wiper) and an electrical motor 212 for operating a door of the vehicle.

The ECU 202 comprises control circuitry 201, for example manifested as a general-purpose processor, an application specific processor, a circuit containing processing components, a group of distributed processing components, a group of distributed computers configured for processing, a field programmable gate array (FPGA), etc. The processor may be or include any number of hardware components for conducting data or signal processing or for executing computer code stored in memory. The memory may be one or more devices for storing data and/or computer code for completing or facilitating the various methods described in the present description. The memory may include volatile memory or non-volatile memory. The memory may include database components, object code components, script components, or any other type of information structure for supporting the various activities of the present description. According to an exemplary embodiment, any distributed or local memory device may be utilized with the systems and methods of this description. According to an exemplary embodiment the memory is communicably connected to the processor (e.g., via a circuit or any other wired, wireless, or network connection) and includes computer code for executing one or more processes described herein.

The ECU 200 is typically also connected to a plurality of sensors/switches using control signals 214, for example used as input for determining if the electrically controllable vehicle components 208, 210, 212 should be set to an activated or a de-activated state. The ECU 202 may also be connected to e.g. a communication interface (such as e.g. a CAN bus or similar, or a dedicated communication interface) of the bus 100 or truck 102, for allowing communication with the vehicle components and/or sensors as mentioned above.

Figure 2B:
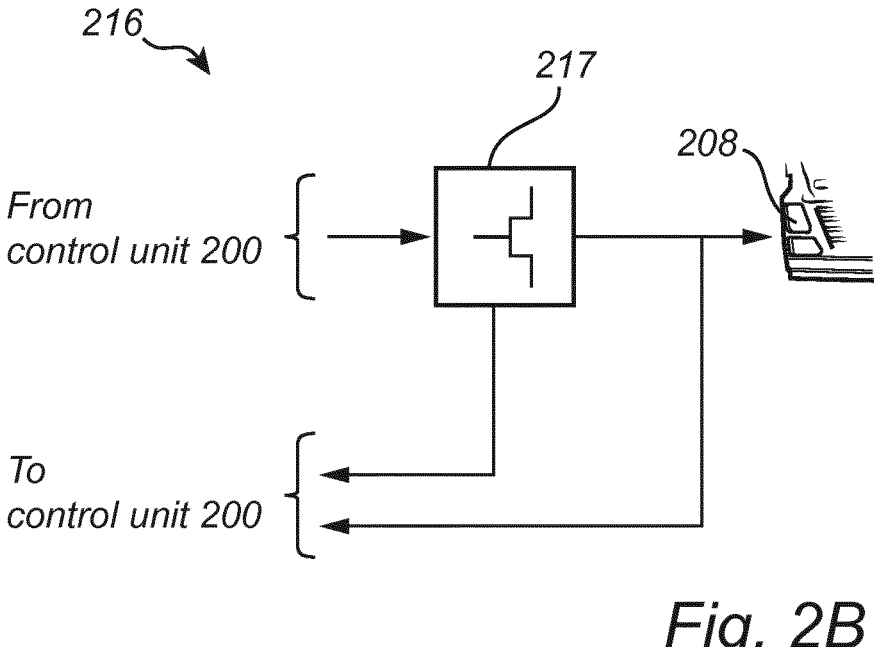
Figure 2C:
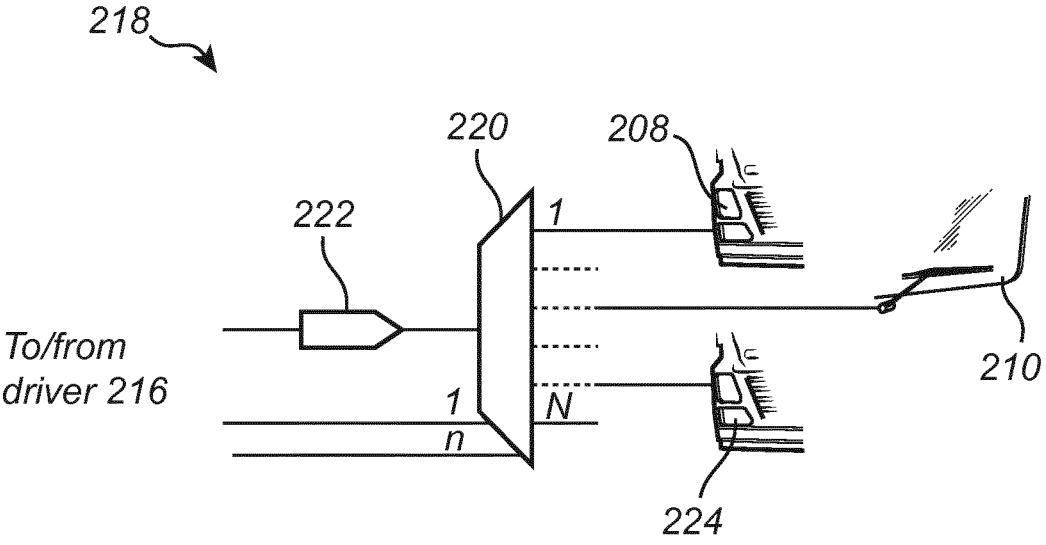
Figure 3:
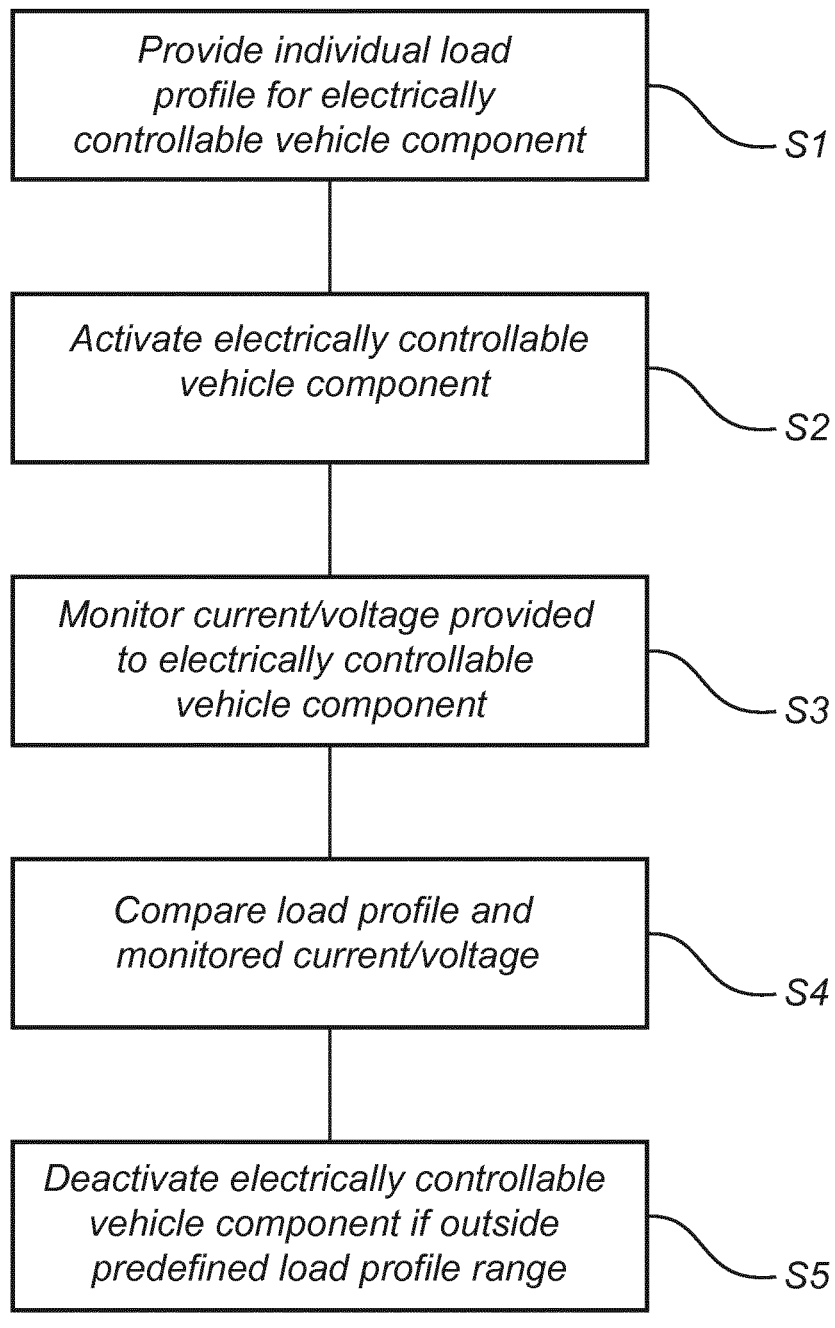
FIG. 3 illustrates the processing steps for performing the method according to the present disclosure.

As is detailed in FIG. 2B and with further reference to FIG. 3, the ECU 200 comprised a plurality of dedicated output ports 216 for controlling each of the electrically controllable vehicle components 208, 210, 212. The ECU 200 is also provided (arranged to store in a digital memory), S1, with individual load profiles for each of the connected electrically controllable vehicle components 208, 210, 212. In FIG. 2B the output port 216 is exemplified as adapted for activating, S2, the light source 208 comprised with the vehicle. The output port 216 is configured to include a driver circuitry 217 arranged to switch the light source 208 from an inactive state (no electrical load) to an active state (e.g. full electrical load; however possible intermediate states are within the scope of the invention).

The driver circuitry 217 is configured to continuously (e.g. once every millisecond, second, etc.) monitor (or sample), S3, at least one of a current and a voltage load for the light source 208 once the light source is in its active state. The driver circuitry 217 is adapted to receive an activation/deactivation signal from the control circuitry 201 of the ECU 200.

The driver circuitry 217 is additionally adapted to provide the control circuitry 201 of the ECU 200 with the intermediate information (implemented as either analog or digitally sampled information) relating to the intermediately sensed voltage and current load of the light source 208. In the illustrated embodiment, the load profile for the light source 208 may for example define that the rating of the light source 208 is 12 volts (with a range from 10.9 V-13.5 V) and a current rating during operation that is 0.8 A (with a rage from 0.6 A-1.0 A).

In case a load profile, being different to the load profile for the light source 208, is to be defined for the actuator 210 or the electrical motor 212, such a profile may additionally comprise a load duration. That is, if for example the current rating is set to 5.5 A (with a normal range from 4.0 A-6.0 A) for the motor 212, the load duration may allow the current draw to exceed the specified normal range with e.g. 50% for e.g. a predefined duration, such as for example 4 seconds. Thus, during the first 4 seconds following a transition from the deactivated state to the activated state (i.e. off to on), the drawn current may be allowed to reach a maximum of 6.0 A+50%=9.0 A.

In accordance to the present disclosure, the information relating to the intermediate current/voltage load will thus be constantly received by the control circuitry 201 of the ECU 200 and compared, S4, to the load profile for that specific electrically controllable vehicle component, such as the motor 212. If the comparison indicates that the intermediate load outside of the set range for the voltage/current, the control circuitry 201 will provide a control signal to set e.g. the light source 208, the actuator 210 or the electrical motor 212 to the de-active state, S5, i.e. to turn the electrically controllable vehicle component off.

It should however be understood that, in relation to the above mentioned case with the electrical motor 212, if the intermediate current load is exceeding 9.0 A also during the initial 4 second active duration, the electrical motor 212 is immediately deactivated. As is indicated above, it is in some embodiments desirable to allow the control circuitry 217 to take into account both the intermediate voltage and the intermediate current in transitioning the electrically controllable vehicle component from the active to the de-deactivated state, in addition to also measure the time the electrically controllable vehicle component is active (to be compared to the predefined load duration).

In addition to the above which specifically relates to the operation of the electrically controllable vehicle component, the monitored intermediate voltage/current load may also in some embodiments be used for detecting a general short-circuit in relation to the electrically controllable vehicle component, short to a battery comprised with the vehicle, or also for determining a state of the driver circuitry 217, e.g. if the driver circuitry 217 shows an indication of being faulty.

If implementing the control circuitry 201 using for example a field programmable gate array (FPGA) as is suggested above, it could be possible to make use of available analog-to-digital (ADC) ports of the FPGA to monitor the voltage levels from the current sensing functionality comprised with the driver circuitry 217. This would allow for the possibility to further simplifying the implementation of the disclosed control functionality (i.e. swift and individualized operation/control of the connected electrically controllable vehicle component)

Furthermore, in a possible scenario that could possibly be too few ADC inputs comprised with the generally selected control circuitry 201 (such as provided with the mentioned FPGA). In such a scenario, as is is exemplified in FIG. 2C, it may be possible to implement a multiplexer (MUX) structure 220 to be connected to the ADC inputs, allowing signals from an extended number of connected driver circuitries 217 may be sequentially scanned. A further port 222 comprised with the ECU 200 will be used for controlling the MUX 220. In the illustrated example, e.g. a further light source 224 is operated in a corresponding manner as discussed above.

To summarize the above, typical prior art ECU implementations relies on drivers configured to themselves handle issues such as short-circuit detection, making the drivers and thereby the resulting ECU expensive. In accordance to the present disclosure, the ECU 200 is to be adapted to internally handle driver diagnostics (including short-circuit detection), allowing for the use of less expensive drivers for controlling a load. In accordance to the present disclosure it is suggested to makes use of a pre-set (predefined and individualized) profile for each of a plurality of different controllable loads, typically defining the mentioned duration, voltage and current limits (possibly including said ranges) for the load. For example, a light source may have a specific load profile, and an actuator may have another specific load profile. It is also possible to define load profiles for a group of (similar) controllable outputs (such as similar actuators/electrical motors/light sources, or similar).

The present disclosure contemplates methods, devices and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor.

By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data that cause a general-purpose computer, special purpose computer, or special purpose processing machines to perform a certain function or group of functions.

Although the figures may show a specific order of method steps, the order of the steps may differ from what is depicted. In addition, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps and decision steps. Additionally, even though the disclosure has been described with reference to specific exemplifying embodiments thereof, many different alterations, modifications and the like will become apparent for those skilled in the art.

Variations to the disclosed embodiments can be understood and effected by the skilled addressee in practicing the claimed disclosure, from a study of the drawings, the disclosure, and the appended claims. Furthermore, in the claims, the word "comprising" does not exclude other elements or steps, and the indefinite article "a" or "an" does not exclude a plurality.

The invention claimed is:

1. An electronic control unit (ECU) for a vehicle, the ECU comprising a first and a second control port configured to be connected to a first and a second electrically controllable vehicle component, respectively, the first and the second electrically controllable vehicle component being individually selected from a group comprising a light source, an actuator, and an electrical motor, wherein:

the first and the second control port each comprises an individual driver circuitry, an individual load profile is predefined for each of the first and the second electrically controllable vehicle component, each individual load profile having an initial start condition determined based on an initial assessment of the respective electrically controllable vehicle component at a beginning of its life cycle, the initial start condition comprising a voltage range, a current range and a load duration, the load duration defining a time period for where the voltage and current is allowed to exceed the voltage and current range, respectively, and wherein the initial start condition is dynamically adjustable based on operational conditions of the vehicle or an external environment of the vehicle, each of the individual driver circuitry for the first and the second control port is configured to individually continuously monitor and measure:

an intermediate voltage and current, defining an electrical load, and a load time for the respectively connected electrically controllable vehicle component, wherein the ECU is configured to:

control a switching between a non-operative (OFF) state and an operative (ON) state for the respective first and second individual driver circuitry, continuously monitor and measure, using each of the individual driver circuitry for the first and the second control port when the respective first and second individual driver circuitry are arranged in the operative (ON) state, an intermediate voltage and current, defining an electrical load, and a load time for the respectively connected electrically controllable vehicle component, compare each of the measured intermediate electrical loads and their related load times with the respective individual load profile for the first and the second electrically controllable vehicle component, control a switching between the operative (ON) state to the non-operative (OFF) state for the respective first and second individual driver circuitry if a result of the comparison indicates that the intermediate load does not correspond to the related individual load profile, adjust the respective initial start conditions of the individual load profiles for the first and second electrically controllable vehicle components over time of controlling the first and second electrically controllable vehicle components, based on a learning process derived from the continuous monitoring and measuring of the intermediate voltage and current, to reduce a safety risk at the first and the second electrically controllable vehicle component and to achieve a same functional output of the electrically controllable vehicle component over its life cycle, as was present at the beginning of the life cycle of the first and second electrically controllable vehicle components.

2. The ECU according to claim 1, wherein the ECU is implemented using at least one of an FPGA, a CPU or a CPLD.

3. The ECU according to claim 1, further comprising at least one multiplexer connected to at least one of the first and the second control port, thereby allowing also at least a further third electrically controllable vehicle component to be connected to the ECU.

4. The ECU according to claim 1, wherein at least one of first and the second control port is a dedicated output port.

5. The ECU according to claim 1, wherein at least one of first and the second control port is a dedicated bidirectional input and output port.

6. A method for operating an electronic control unit (ECU) for a vehicle, the ECU comprising a first and a second control port configured to be connected to a first and a second electrically controllable vehicle component, respectively, the first and the second electrically controllable vehicle component selected from a group comprising a light source, an actuator, and an electrical motor, wherein the first and the second control port each comprises an individual driver circuitry, an individual load profile is predefined for each of the first and the second electrically controllable vehicle component, each individual load profile having an initial start condition determined based on an initial assessment of the respective electrically controllable vehicle component at a beginning of its life cycle, the initial start condition comprising a voltage range, a current range and a load duration, the load duration defining a time period for where the voltage and current is allowed to exceed the voltage and current range, respectively, and wherein the initial start condition is dynamically adjustable based on operational conditions of the vehicle or an external environment of the vehicle, and each of the individual driver circuitry for the first and the second control port is configured to individually continuously monitor and measure an intermediate voltage and current, defining an electrical load, and a load time for the respectively connected electrically controllable vehicle component, wherein the method comprises the steps of: controlling a switching between a non-operative (OFF) state and an operative (ON) state for the respective first and second individual driver circuitry, continuously monitoring and measuring, using each of the individual driver circuitry for the first and the second control port when the respective first and second individual driver circuitry are arranged in the operative (ON) state, an intermediate voltage and current, defining an electrical load, and a load time for the respectively connected electrically controllable vehicle component, comparing each of the measured intermediate electrical loads and their related load times with the respective individual load profile for the first and the second electrically controllable vehicle component, controlling a switching between the operative (ON) state to the non-operative (OFF) state for the respective first and second individual driver circuitry if a result of the comparison indicates that the intermediate load does not correspond to the related individual load profile, adjust the respective initial start conditions of the individual load profiles for the first and second electrically controllable vehicle components over time of controlling the first and second electrically controllable vehicle components, based on a learning process derived from the continuous monitoring and measuring of the intermediate voltage and current, to reduce a safety risk at the first and the second electrically controllable vehicle component and to achieve a same functional output of the electrically controllable vehicle component over its life cycle, as was present at the beginning of the life cycle of the first and second electrically controllable vehicle components.

7. A computer program product comprising a non-transitory computer readable medium having stored thereon a computer program for operating an electronic control unit (ECU) for a vehicle, the ECU comprising a first and a second control port configured to be connected to a first and a second electrically controllable vehicle component, respectively, the first and the second electrically controllable vehicle component selected from a group comprising a light source, an actuator, and an electrical motor, wherein the first and the second control port each comprises an individual driver circuitry, an individual load profile is predefined for each of the first and the second electrically controllable vehicle component, each individual load profile having an initial start condition determined based on an initial assessment of the respective electrically controllable vehicle component at a beginning of its life cycle, the initial start condition comprising a voltage range, a current range and a load duration, the load duration defining a time period for where the voltage and current is allowed to exceed the voltage and current range, respectively, and wherein the initial start condition is dynamically adjustable based on operational conditions of the vehicle or an external environment of the vehicle, and each of the individual each driver circuitry for the first and the second control port is configured to individually continuously monitor and measure an intermediate voltage and current, defining an electrical load, and a load time for the respectively connected electrically controllable vehicle component, wherein the computer program product comprises code for:

controlling a switching between a non-operative (OFF) state and an operative (ON) state for the respective first and second individual driver circuitry,

continuously monitoring and measuring, using each of the individual driver circuitry for the first and the second control port when the respective first and second individual driver circuitry are arranged in the operative (ON) state, an intermediate voltage and current, defining an electrical load, and a load time for the respectively connected electrically controllable vehicle component comparing each of the measured intermediate electrical loads and their related load times with the respective individual load profile for the first and the second electrically controllable vehicle component, controlling a switching between the operative (ON) state to the non-operative (OFF) state for the respective first and second individual driver circuitry if a result of the comparison indicates that the intermediate load does not correspond to the related individual load profile, and adjust the respective initial start conditions of the individual load profiles for the first and second electrically controllable vehicle components over time of controlling the first and second electrically controllable vehicle components, based on a learning process derived from the continuous monitoring and measuring of the intermediate voltage and current, to reduce a safety risk at the first and the second electrically controllable vehicle component and to achieve a same functional output of the electrically controllable vehicle component over its life cycle, as was present at the beginning of the life cycle of the first and second electrically controllable vehicle components.

* * * * *